(12) United States Patent
Yi et al.

(10) Patent No.: US 10,158,066 B1
(45) Date of Patent: Dec. 18, 2018

(54) TWO PASS MRAM DUMMY SOLUTION

(71) Applicant: GLOBALFOUNDRIES Singapore Pte. Ltd., Singapore (SG)

(72) Inventors: Wanbing Yi, Singapore (SG); Neha Nayyar, Malta, NY (US); Curtis Chun-I Hsieh, Singapore (SG); Mahesh Bhatkar, Singapore (SG); Wenjun Liu, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/616,624

(22) Filed: Jun. 7, 2017

(51) Int. Cl.
*H01L 21/00* (2006.01)
*H01L 43/12* (2006.01)
*H01L 43/02* (2006.01)
*H01L 43/08* (2006.01)

(52) U.S. Cl.
CPC .............. *H01L 43/12* (2013.01); *H01L 43/02* (2013.01); *H01L 43/08* (2013.01)

(58) Field of Classification Search
None
See application file for complete search history.

(56) References Cited

U.S. PATENT DOCUMENTS

| | | |
|---|---|---|
| 7,804,706 B2 | 9/2010 | Zhong et al. |
| 8,614,912 B2 | 12/2013 | Lee et al. |
| 8,772,051 B1 | 7/2014 | Zhong et al. |

*Primary Examiner* — Long Pham
(74) *Attorney, Agent, or Firm* — Ditthavong & Steiner, P.C.

(57) ABSTRACT

Methods of fabricating a flexible dummy fill to increase MTJ density are provided. Embodiments include forming a first oxide layer; forming lower interconnect layers in the first oxide layer; forming a nitride layer over the first oxide layer and the lower interconnect layers; forming a second oxide layer over the nitride layer; forming bottom electrodes through the second oxide layer and the nitride layer contacting a portion of an upper surface of the lower interconnect layers; forming MTJ structures over the bottom electrodes; forming top electrodes over the MTJ structures; and forming upper interconnect layers over one or more of the top electrodes.

8 Claims, 2 Drawing Sheets

TWO PASS MRAM DUMMY SOLUTION

TECHNICAL FIELD

The present disclosure relates to memory design for semiconductor devices. The present disclosure is particularly applicable to magnetic random-access memory (MRAM) structures in integrated circuit (IC) and methods for fabricating the same.

BACKGROUND

MRAM is rapidly replacing conventional memory. One critical aspect of the MRAM technology development is forming a magnetic tunnel junction (MTJ) structure for MTJ memory devices. However, conventional integration schemes requires chemical mechanical planarization (CMP) for planarization before forming a top electrode, e.g., a via or trench filled with conducting material over the MTJ structure. The top electrode is much dependent on the planarization step and it may damage the MTJ structure without proper planarization. To achieve a flat surface, a closer MTJ density to memory array is required across the chip to have a good CMP uniformity. On the other hand, end point detection is usually used in the top electrode opening step to avoid excessive etch which damages MTJ. A higher MTJ density is required to achieve a stronger end point detection signal. The conventional MTJ dummy placement depends much on the upper and lower interconnects. The intrinsic density is hence constrained by the upper and lower interconnects and it is not easy to achieve uniformity in dummy fill with density close to memory array.

A need therefore exists for methodology enabling a flexible dummy fill to increase MTJ density and the related device.

SUMMARY

An aspect of the present disclosure is a method of forming dummy metal layers above and below a MTJ structure.

Another aspect of the present disclosure is a method of forming a dummy metal layer above a MTJ structure and an active metal layer below the MTJ structure.

Another aspect of the present disclosure is a device including dummy metal layers above and below a MTJ structure.

Another aspect of the present disclosure is a device including a dummy metal layer above a MTJ structure and an active metal layer below the MTJ structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first oxide layer; forming lower interconnect layers in the first oxide layer; forming a nitride layer over the first oxide layer and the lower interconnect layers; forming a second oxide layer over the nitride layer; forming bottom electrodes through the second oxide layer and the nitride layer contacting a portion of an upper surface of the lower interconnect layers; forming MTJ structures over the bottom electrodes; forming top electrodes over the MTJ structures; and forming upper interconnect layers over one or more of the top electrodes.

Aspects of the present disclosure include forming the lower interconnect layers and the upper interconnect layers of a dummy metal. Further aspects include forming the lower interconnect layers of an active metal and the upper interconnect layers of a dummy metal. Another aspect includes forming the active metal of copper (Cu), cobalt (Co) or ruthenium (Ru). Further aspects include forming the bottom electrodes by: forming a plurality of vias by plasma dry etch through the second oxide layer and the nitride layer contacting a portion of an upper surface of the lower interconnect layer; and filling the plurality of vias with conducting materials, wherein the conducting materials includes tantalum nitride (TaN). Additional aspects include forming the MTJ structures by: forming a MTJ layer over the TaN via and the oxide layer; etching the MTJ layer to form MTJ pillars over center portions of the bottom electrodes; forming silicon nitride (SiN) spacers on the sidewalls of the MTJ pillars; forming a third oxide layer over the second oxide layer, the SiN spacers and the MTJ pillars; and planarizing the third oxide layer with some remaining on top of the MTJ pillars by CMP. Further aspects include forming the top electrodes by: forming a plurality of first trenches by plasma dry etch in the third oxide layer exposing upper surface of the MTJ structures; filling the plurality of first trenches with conducting material, wherein the conducting materials includes tantalum nitride (TaN); and removing excessive TaN by CMP. Additional aspects include forming the upper interconnect layers by: forming a fourth oxide layer over the third oxide layer and the top electrodes; forming a plurality of second trenches by etching through the fourth oxide layer exposing a portion of upper surface of the top electrodes; and filling the plurality of second trenches with conducting materials, wherein the conducting materials comprises dummy interconnects.

A further of the present disclosure is a method including: forming a first oxide layer; forming lower interconnect layers in the first oxide layer; forming a nitride layer over the first oxide layer and the lower interconnect layers; forming a second oxide layer over the nitride layer; forming MTJ structures over portions of the second oxide layer; forming top electrodes over the MTJ structures; and forming upper interconnect layers over one or more of the top electrodes.

Aspects of the present disclosure include placing the MTJ structures independent of the position of the lower interconnect layers. Another aspect includes forming the lower interconnect layers and the upper interconnect layers of a dummy metal. Further aspect includes forming the lower interconnect layers of an active metal and the upper interconnect layers of a dummy metal. Additional aspect includes forming the active metal of Cu, Co or Ru.

Another aspect of the present disclosure is a device including: a first oxide layer; lower interconnect layers in the first oxide layer; a nitride layer over the first oxide layer and the lower interconnect layers; a second oxide layer over the nitride layer; bottom electrodes through the second oxide layer and the nitride layer contacting a portion of an upper surface of the lower interconnect layers; MTJ structures over the bottom electrodes; a third oxide layer over the second oxide layer and the MTJ structures; top electrodes through the third oxide layer over the MTJ structures; a fourth oxide layer over the third oxide layer and the top electrodes; and upper interconnect layers through the fourth oxide layer over one or more of the top electrodes.

Aspects of the device include the lower interconnect layers and the upper interconnect layers including a dummy metal. Another aspect includes the lower interconnect layers including an active metal and the upper interconnect layers including a dummy metal. Other aspects include the active metal including Cu, Co or Ru. Additional aspects include the lower interconnect layers having a thickness of 80 nanometer (nm) to 800 nm and a width of 40 nm to 400 nm. A further aspect includes the upper interconnect layers having a thickness of 80 nm to 800 nm and a width of 40 nm to 400 nm. Another aspect includes the top and bottom electrodes having a depth of 30 nm to 150 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of lower and inflexible MTJ density attendant upon flexible dummy fill. The problem is solved, inter alia, by flexible dummy placement with topology control above and below a MTJ structure for a relatively higher and tunable MTJ density. A dummy solution is needed for both standalone and embedded applications, especially the latter. Ideally, the dummy design depends on the actual product layouts wherein empty spaces are filled as much as possible, and is not short to any active metals. The active metals may be interconnects carrying electrical signal and are part of the active routing of a product. The dummy metals may be redundant interconnects carrying no electrical signal and are used to improve process uniformity.

Methodology in accordance with embodiments of the present disclosure includes forming a first oxide layer, and etching the first oxide layer to form lower interconnect layers. A nitride layer is then formed over the first oxide layer and the lower interconnect layers. Next, a second oxide layer is formed over the nitride layer. Thereafter, bottom electrodes are formed through the second oxide layer and the nitride layer contacting a portion of an upper surface of the lower interconnect layers. Next, MTJ structures are formed over the bottom electrodes. Then, top electrodes are formed over the MTJ structures. Next, upper interconnect layers are formed over the top electrodes.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
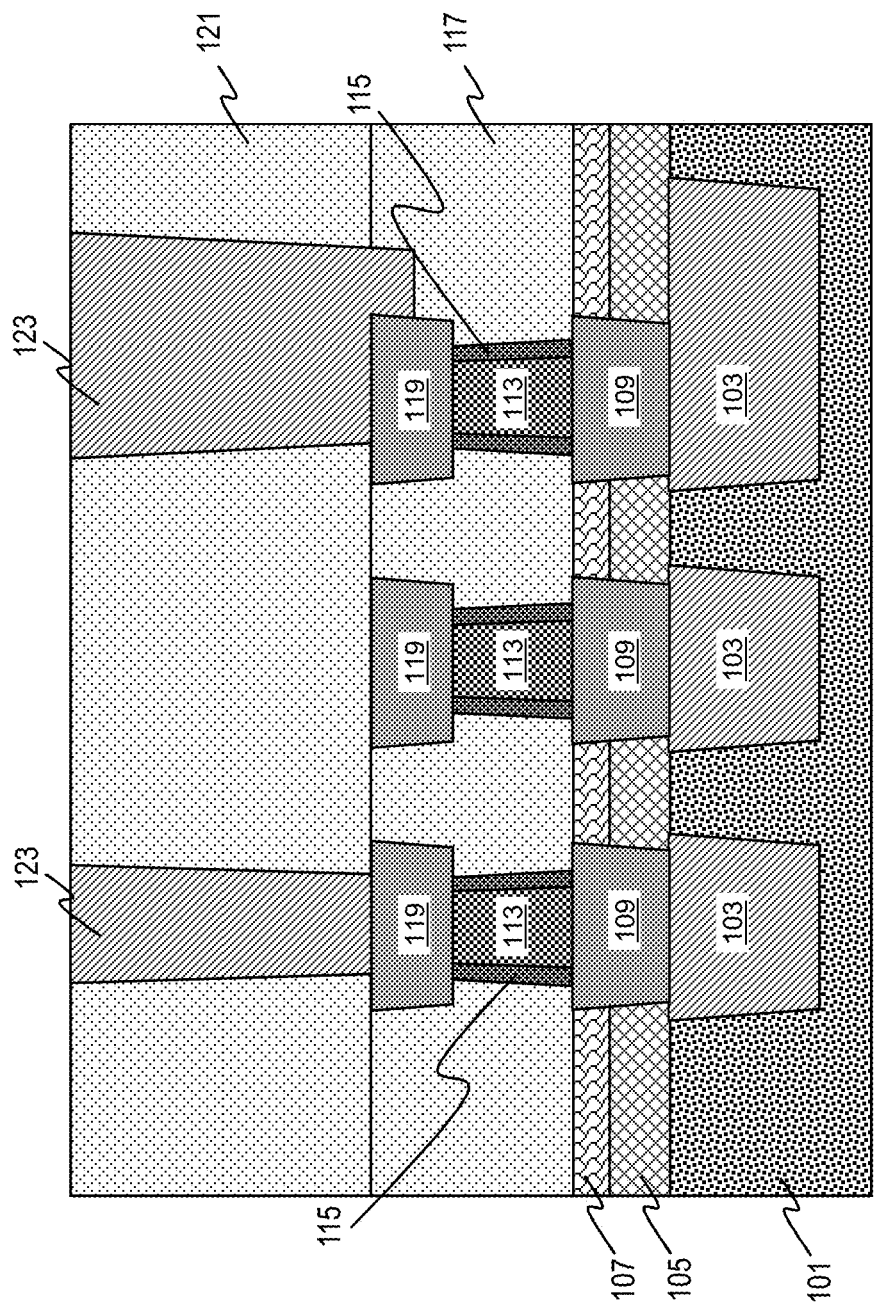
FIG. 1 illustrates, in cross-sectional view, a portion of a process flow for forming a full stack dummy metal layers above and below a MTJ structure connected by a top and bottom electrodes respectively, in accordance with an exemplary embodiment.

FIG. 1 illustrate a process flow for forming a full stack dummy metal layers above and below a MTJ structure connected by a top and bottom electrodes respectively, in accordance with an exemplary embodiment. Adverting to FIG. 1, an oxide layer 101 is formed over a semiconductor substrate with transistors and a few layers of interconnects. The first oxide layer 101 may include, e.g., an ultra low-k (ULK), a low-K (LK), or other silicon oxide materials. Next, the oxide layer 101 is etched to form trenches (not shown for illustrative convenience) to a depth, e.g., of 80 nm to 800 nm and to a width, e.g., larger than 40 nm. Then, the trenches are filled with conducting materials, e.g., copper (Cu), cobalt (Co), forming lower interconnect layers 103. A nitride layer 105 is formed to a thickness, e.g., of 10 nm to 50 nm over the oxide layer 101 and the lower interconnect layers 103. The nitride layer 105 may include, e.g., silicon carbide nitride, silicon nitride or other capping layers. An oxide layer 107 is formed to a thickness, e.g., of 20 nm to 100 nm over the nitride layer 105. Next, a plurality of vias or trenches (not shown for illustrative convenience) are formed to a depth, e.g., of 30 nm to 150 nm by, e.g., a plasma dry etch through the oxide layer 107 and the nitride layer 105 contacting an upper portion of the lower interconnect layers 103. Then, the vias or trenches are filled with TaN or other conducting materials and are planarized by CMP forming bottom electrodes/TaN vias 109. A MTJ layer (not shown for illustrative convenience) is formed over the exposed upper surface of the TaN vias 109 and the oxide layer 107. Then, the MTJ layer is etched, e.g., by inert gas plasma dry etch to form MTJ pillars 113 having a thickness, e.g., of 30 nm to 150 nm centered over the exposed upper surface of the TaN vias 109. A configuration capable of etching the sidewalls of the MTJ pillars 113 with tilted angel is preferred. Next, SiN spacers 115 are formed on the sidewalls of the MTJ pillars 113, e.g., by chemical vapor deposition (CVD) or atomic layer deposition (ALD) process followed by a blanket plasma dry etch. Then, an oxide layer 117 is deposited over the MTJ pillars 113 and the SiN spacers 115, and is planarized by CMP with MTJ pillars not exposed. The oxide layer 117 includes, e.g., ULK, LK or any other silicon oxide materials. Next, a plurality of trenches (not shown for illustrative convenience) are formed, e.g., by plasma dry etch to a depth, e.g., of 30 nm to 150 nm through the oxide layer 117 contacting upper surface of the SiN spacers 115 and the MTJ pillars 113. Then, the trenches are filled with TaN or other conducting materials and are planarized by CMP forming top electrodes/TaN trenches 119. An oxide layer 121 is formed over the oxide layer 117 and the top electrodes 119. The oxide layer 117 includes, e.g., ULK, LK or any other silicon oxide. Next, a plurality of trenches (not shown for illustrative convenience) are formed, e.g., by plasma dry etch to a depth, e.g., of 80 nm to 800 nm through the oxide layer 121 contacting upper surface of the one or more top electrodes 119. A first trench may be formed within the width of the first top electrode 119 and a second trench may be formed overlapping the third top electrode 119. A trench is not formed over the middle top electrode 119. Then, the first and second trenches are filed with conducting materials forming an upper interconnect layers 123. The upper interconnect layers 123 are separated by top electrodes 119 to avoid potential damages to the MTJ pillars 113 from upper interconnect layers 123 processes, e.g., etching. The full stack dummy cell includes bottom electrodes/TaN vias 109, MTJ dummy pillars 113 and top electrodes 119. The lower interconnect layers 103 needs to be placed beneath it as an etch stop during bottom electrode via/trench formation. While there is no constraint on the formation or placement of the upper interconnect layers 123, it can be formed to any width allowed by the process capability, e.g., the left upper interconnect layer 123 is formed within the first top electrode 119, an upper interconnect is not formed over the middle top electrode 119, and the right upper interconnect layer 123 is formed overlapping the right top electrode 119.

Figure 2:
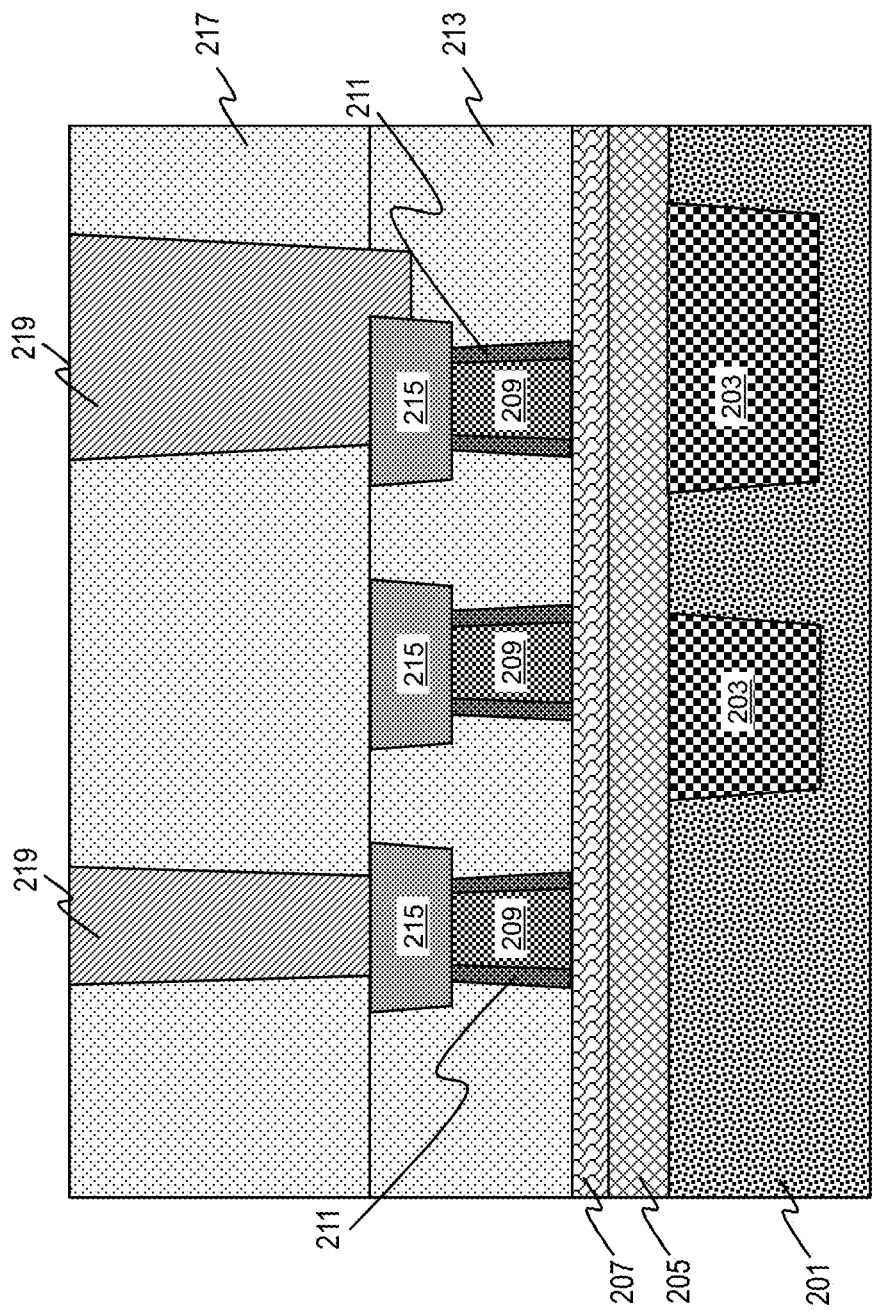
FIG. 2 illustrates, in cross-sectional view, a portion of a process flow for forming a partial stack with active metal layers below the MTJ structure without a bottom electrode, and dummy metal layers above a MTJ structure connected by a top electrode, in accordance with an exemplary embodiment.

FIG. 2 illustrates a partial stack with active metal below the MTJ structure without a bottom electrode, and flexible dummy metal above a MTJ structure connected by a top electrode, in accordance with an exemplary embodiment. The process flow for FIG. 2 is the same as FIG. 1. The partial stack dummy cell includes MTJ dummy pillars 209 and top electrodes 215. There is no constraint on the formation and placement of the lower interconnects 203 with active metal and the partial stack may be placed anywhere, e.g., on top of the lower interconnects 203 or an empty space. Further, there is no constraint on the upper interconnect layer 219 which may be formed to any width allowed by process capability.

The full stack dummy cell and the partial stack dummy cell may be combined wherein priority may be given to the full stack dummy cell because it includes bottom electrode which improves CMP uniformity during bottom electrode formation. The first dummy fill may use full stack dummy cell in region with dummy lower metal, whereas the second dummy fill may use partial stack dummy cell in region with active lower metal.

The embodiments of the present disclosure can achieve several technical effects, such as higher intrinsic MTJ density because more dummy MTJ can be placed from the partial stack dummy cell, thereby providing a closer MTJ density as memory array and enabling end point detection during top electrode etch process. In addition, the present method provides a more flexible MTJ dummy placement, having less constraint from the upper and lower interconnects and helping CMP uniformity especially for embedded products. Further, the present method is fully logic compatible and does not require changes on a logic dummy fill. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices having MRAM structures.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first oxide layer;
   forming lower interconnect layers in the first oxide layer;
   forming a nitride layer over the first oxide layer and the lower interconnect layers;
   forming a second oxide layer over the nitride layer;
   forming bottom electrodes through the second oxide layer and the nitride layer contacting a portion of an upper surface of the lower interconnect layers;
   forming magnetic tunnel junction (MTJ) structures over the bottom electrodes;
   forming top electrodes over the MTJ structures; and
   forming upper interconnect layers over one or more of the top electrodes.

2. The method according to claim 1, comprising forming the lower interconnect layers of an active metal, the active metal comprising copper (Cu), cobalt (Co) or ruthenium (Ru).

3. The method according to claim 1, comprising forming the bottom electrodes by:
   forming a plurality of vias by plasma dry etch through the second oxide layer and the nitride layer contacting a portion of an upper surface of the lower interconnect layer; and
   filling the plurality of vias with conducting materials, wherein the conducting materials comprises tantalum nitride (TaN).

4. The method according to claim 1, comprising forming the MTJ structures by:
   forming a MTJ layer over the TaN via and the oxide layer;
   etching the MTJ layer to form MTJ pillars over center portions of the bottom electrodes;
   forming silicon nitride (SiN) spacers on the sidewalls of the MTJ pillars;
   forming a third oxide layer over the second oxide layer, the SiN spacers and the MTJ pillars; and
   planarizing the third oxide layer with some remaining on top of the MTJ pillars by chemical mechanical planarization (CMP).

5. The method according to claim 1, comprising forming the top electrodes by:
   forming a plurality of first trenches by plasma dry etch in the third oxide layer exposing upper surface of the MTJ structures;
   filling the plurality of first trenches with conducting material, wherein the conducting materials comprises tantalum nitride (TaN); and
   removing excessive TaN by chemical mechanical planarization (CMP).

6. The method according to claim 1, comprising forming the upper interconnect layers by:
   forming a fourth oxide layer over the third oxide layer and the top electrodes;
   forming a plurality of second trenches by etching through the fourth oxide layer exposing a portion of upper surface of the top electrodes; and
   filling the plurality of second trenches with conducting materials, wherein the conducting materials comprises dummy interconnects.

7. A method comprising:
   forming a first oxide layer;
   forming lower interconnect layers in the first layer;
   forming a nitride layer over the first oxide layer and the lower interconnect layers;
   forming a second oxide layer over the nitride layer;
   forming magnetic tunnel junction (MTJ) structures over portions of the second oxide layer;
   forming top electrodes over the MTJ structures; and
   forming upper interconnect layers over one or more of the top electrodes.

8. The method according to claim 7, comprising forming the lower interconnect layers of an active metal, the active metal comprising copper (Cu), cobalt (Co) or ruthenium (Ru).

* * * * *